US 6,738,401 B2

(12) United States Patent
Bowler et al.

(10) Patent No.: US 6,738,401 B2
(45) Date of Patent: May 18, 2004

(54) HIGH SPEED SWITCHING DRIVER

(75) Inventors: David B. Bowler, Acton, MA (US); Barry D. Colella, Newburyport, MA (US); Colby Dill, III, Holliston, MA (US); Bruce C. Pratt, Bedford, NH (US)

(73) Assignee: Quantum Bridge Communications, Inc., Andover, MA (US)

( * ) Notice: Subject to any disclaimer, the term of this patent is extended or adjusted under 35 U.S.C. 154(b) by 0 days.

(21) Appl. No.: 09/975,082

(22) Filed: Oct. 11, 2001

(65) Prior Publication Data

US 2003/0072339 A1 Apr. 17, 2003

(51) Int. Cl.[7] .................................................. H01S 3/00
(52) U.S. Cl. ................................ 372/38.02; 372/38.03
(58) Field of Search .......................... 372/38.02, 38.03, 372/38.04, 29.07, 38.07, 38.06, 29.015

(56) References Cited

U.S. PATENT DOCUMENTS

| | | | |
|---|---|---|---|
| 5,036,519 A | | 7/1991 | Ema et al. |
| 5,263,049 A | | 11/1993 | Winen ........................ 375/36 |
| 5,398,008 A | * | 3/1995 | Nissler et al. ............... 322/178 |
| 5,579,328 A | * | 11/1996 | Habel et al. .................... 372/31 |
| 5,623,355 A | * | 4/1997 | Olsen ........................ 359/110 |
| 5,646,763 A | * | 7/1997 | Misaizu et al. ............. 359/187 |
| 5,708,673 A | * | 1/1998 | Ikeuchi ........................ 372/38 |
| 5,754,577 A | | 5/1998 | Casper et al. |
| 5,802,089 A | | 9/1998 | Link |
| 5,850,409 A | * | 12/1998 | Link ........................... 372/28 |
| 5,867,484 A | * | 2/1999 | Shaunfield ................... 370/254 |
| 5,883,910 A | * | 3/1999 | Link ............................. 372/38 |
| 6,018,540 A | | 1/2000 | Kinoshita ..................... 372/46 |
| 6,044,095 A | * | 3/2000 | Asano et al. .................. 372/31 |
| 6,078,414 A | | 6/2000 | Iwano ........................ 359/124 |
| 6,130,575 A | | 10/2000 | Nelson et al. ............... 327/540 |
| 6,137,607 A | | 10/2000 | Feldman et al. |
| 6,195,371 B1 | | 2/2001 | Haneda et al. ........... 372/29.01 |
| 6,215,295 B1 | | 4/2001 | Smith, III |
| 6,249,178 B1 | * | 6/2001 | Umeda ........................ 372/563 |
| 6,256,329 B1 | | 7/2001 | Ishizuka et al. ......... 372/38.02 |
| 6,285,692 B1 | | 9/2001 | Okayasu ................... 372/38.02 |
| 6,307,402 B1 | | 10/2001 | Hedberg ...................... 326/86 |
| 6,313,662 B1 | | 11/2001 | Ide .............................. 326/83 |
| 6,348,817 B2 | | 2/2002 | Lu et al. ..................... 327/108 |
| 6,370,175 B1 | | 4/2002 | Ikeda et al. |

OTHER PUBLICATIONS

Fujitsu Laser Driver FMM3171VI data sheet, ed. 1.2, Jun. 2000.

* cited by examiner

*Primary Examiner*—Paul Ip
*Assistant Examiner*—Phillip Nguyen
(74) *Attorney, Agent, or Firm*—Hamilton, Brook, Smith & Reynolds, P.C.

(57) ABSTRACT

The present invention is generally directed towards a system and method for providing a high speed switching driver to transmit data information. A first current is switched through a diode or shunted through an alternate path to selectively bias the diode. A second current can also be selectively switched through the diode to modulate a light energy output transmitted from the diode. Based on this configuration, fast bias-switching for generating a modulated laser diode output can be achieved by selectively switching the bias current through the diode or alternate path. Consequently, a solid state device can be controlled to transmit data information after a relatively minimal setup time delay to bias the diode.

35 Claims, 7 Drawing Sheets

HIGH SPEED SWITCHING DRIVER

BACKGROUND OF THE INVENTION

Laser diodes are typically used to transmit data information over fiber optic networks. To achieve higher speed data rates, a laser diode can be biased with a drive current so it is 'ON' and produces at least a minimal optical output. While the diode is biased, the diode can be driven with additional current so that the light output of the diode varies over time between two power output levels. One power output level of the diode can represent a logic low while another power output level of the diode can represent a logic high.

SUMMARY OF THE INVENTION

One aspect of the present invention is directed towards a system and method for providing high speed switching to transmit data information. This can be achieved by switching current through a diode or alternate path rather than adjusting a setting of a current source between 0.0 mA (to turn off the diode) and $I_{BIAS}$ (to bias the diode). Complex circuitry often used in precision current sources ordinarily do not lend themselves to high speed adjustments that would be necessary to rapidly shut off, bias or modulate a diode for transmitting.

In an illustrative embodiment, a current is switched through a diode or shunted through an alternate path to selectively bias a diode for transmitting. When the current is switched through the diode, the diode can be biased for generating a light output. A second current can be selectively switched through the diode to modulate a light energy output transmitted from the diode. Based on this configuration, fast bias-switching for generating a modulated laser diode output can be achieved by selectively switching the bias current through the diode or alternate path. Consequently, a solid state device can be controlled to transmit data information after a relatively minimal setup time delay to bias the diode.

A light output of the diode can be coupled to a fiber to transmit information over an optical network such as a passive optical network or cable television (CATV). In such applications, hi-speed biasing of the diode or multiple diodes can be used to more efficiently transmit information via time division multiplexing. That is, one of multiple diodes can be selectively activated in minimal time to transmit a modulated signal over a fiber network shared by multiple transmitters. The other diodes not transmitting can be almost completely shut down so that they do not interfere with the activated diode.

A resistor can be disposed in series with the diode to dissipate energy and reduce chirping of the circuit during the "switch over" process of biasing the diode. In one application, the resistor is greater than 20 ohms so that the power output of the diode makes a smooth transition when it is switched or modulated. This resistor can be split into two separate resistors, one in each of the modulation and bias current paths.

A current switched to bias or modulate the diode also can be adjusted to compensate for aging of the diode. For example, when a light energy output of the diode decays due to aging or the system changes temperature, the bias or modulation current can be increased or decreased so that the diode still generates a bias and modulation output at particular power levels.

One method for selectively switching the bias current involves disposing a first switch in series with the diode and a second switch along an alternate path so that the bias current can be switched either through the diode or the alternate path depending on which of the two switches is activated. In such an application, switching can be controlled so that one switch has a lower impedance than the other. Accordingly, the current can be directed through the switch (and path) having the lower impedance.

In one application, the first and second switches are driven with a differential signal to selectively bias the diode. More specifically, part of the differential signal can be used to control one switch while another part of the differential signal can be used to control the other switch. When the differential signal is binary, one of the pair of switches is typically active except during a transition period between changing states. This transition period can be minimal when hi-speed differential drivers are used to control a state of the switches. In this instance, the bias current is generally either selectively switched to bias the diode or is shunted through an alternate path. To provide fast switching times, bipolar transistor switches can be driven with a differential signal based on ECL (Emitter Coupled Logic) or other suitable voltage levels.

In a similar manner as discussed for the bias current, the modulation current can be switched through the diode or another alternate path using a pair of switches such as bipolar transistors driven by a differential voltage signal to modulate the diode for transmitting.

To ensure that the bias current is set properly, a power level of light transmitted by the diode can be measured while the diode is biased. Based on a measured output of the diode, feedback can be used to adjust the bias current so that the diode produces a light output within a specified range when biased.

The diode also can be calibrated for storing setting information in memory. Typically, a bias and modulation current are selected so that a receiver of the optical signal generated by the diode can detect corresponding logic levels of each data bit transmitted in a packet or time frame.

The previously discussed aspects of the present invention have advantages over the prior art. For example, one application of the present invention involves transmitting data information from one of multiple laser diodes to a target device in a shared network. Since the laser diode can be biased to transmit data information in minimal time, the bandwidth of the shared network can be increased.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
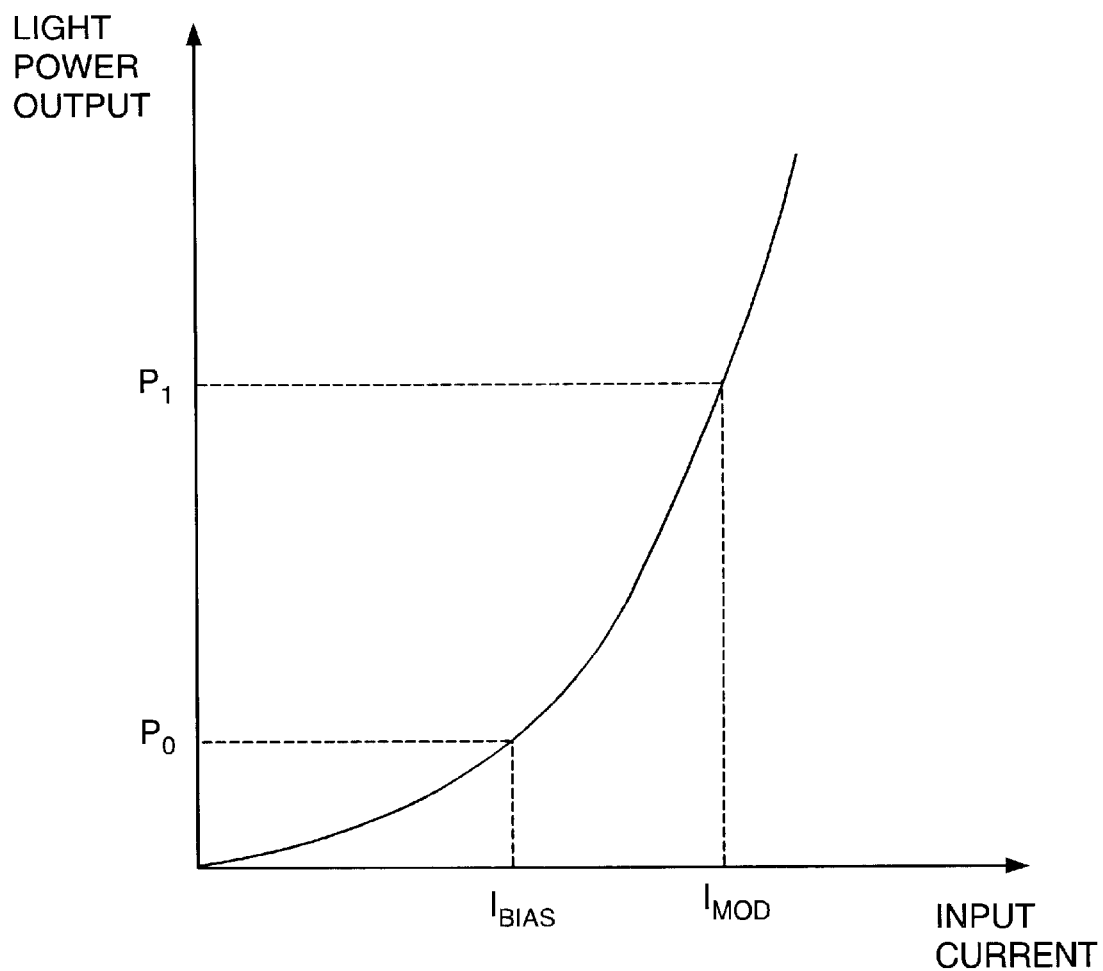
FIG. 1 is a graph of input current versus light power output of a laser diode device according to certain principles of the present invention.

FIG. 1 is a graph showing the relationship between optical Power and Current (P-I) for a laser diode. As shown, the power output (P) from the laser diode depends on the input pump current (I). As the input pump current (I) reaches a lasing threshold current $I_{th}$, the power output P increases rapidly with each successive increase in input pump current I.

Figure 2:
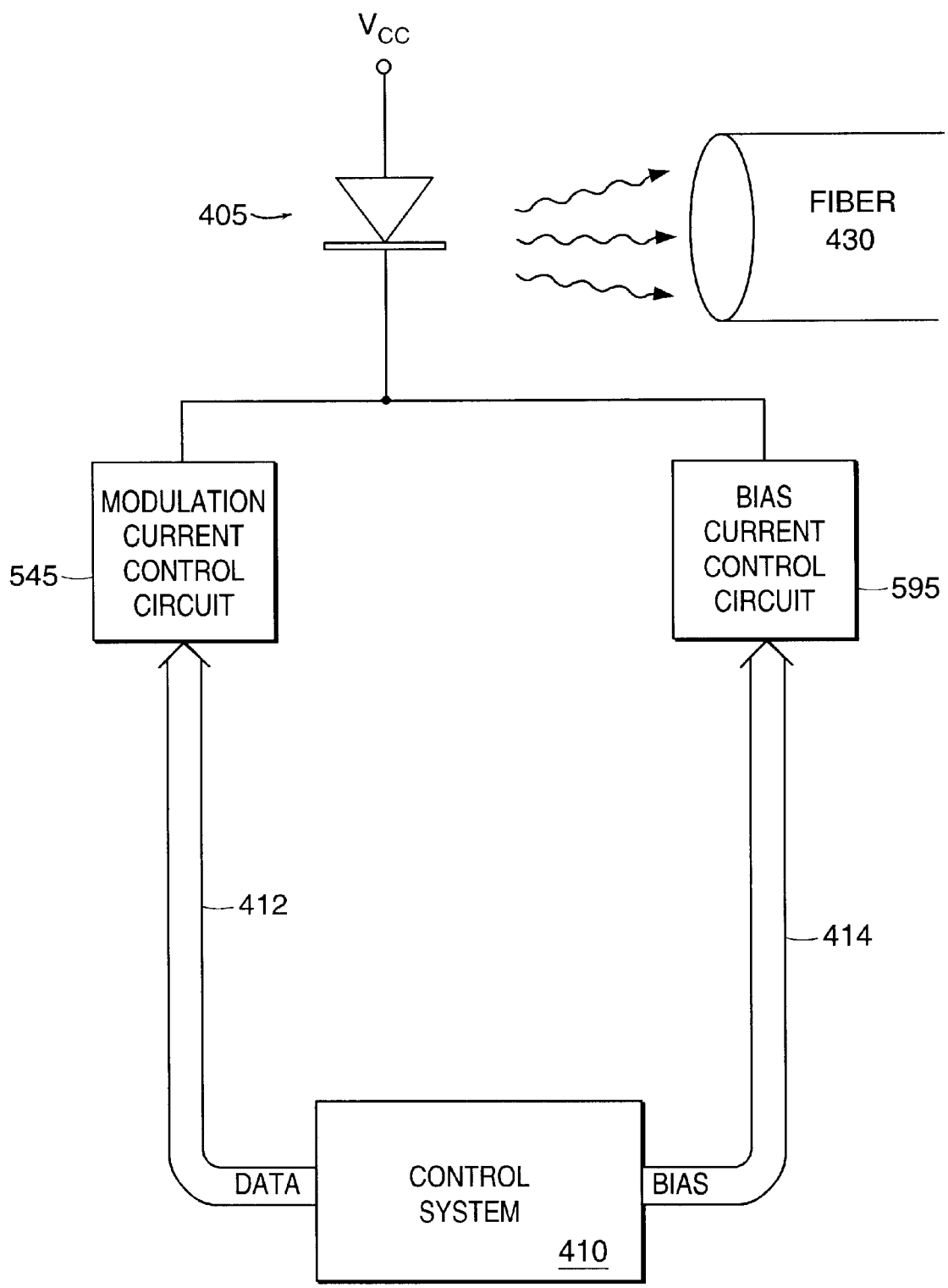
FIG. 2 is a block diagram of a burst mode laser system according to certain principles of the present invention.

FIG. 2 is a block diagram of a burst mode laser driver according to certain principles of the present invention. As shown, control system 410 generates data signal 412 and bias signal 414 that respectively drive modulation current control circuit 545 and bias current control circuit 595. A combination of these circuits can be used to control the light output generated by a solid state device such as diode 405. The light output generated by diode 405 can be coupled to fiber 430 of a shared medium network to transmit binary data information.

Control system 410 can include software, processor devices, memory devices and related circuitry to generate control signals 412, 414 for selectively switching diode 405.

Figure 3:
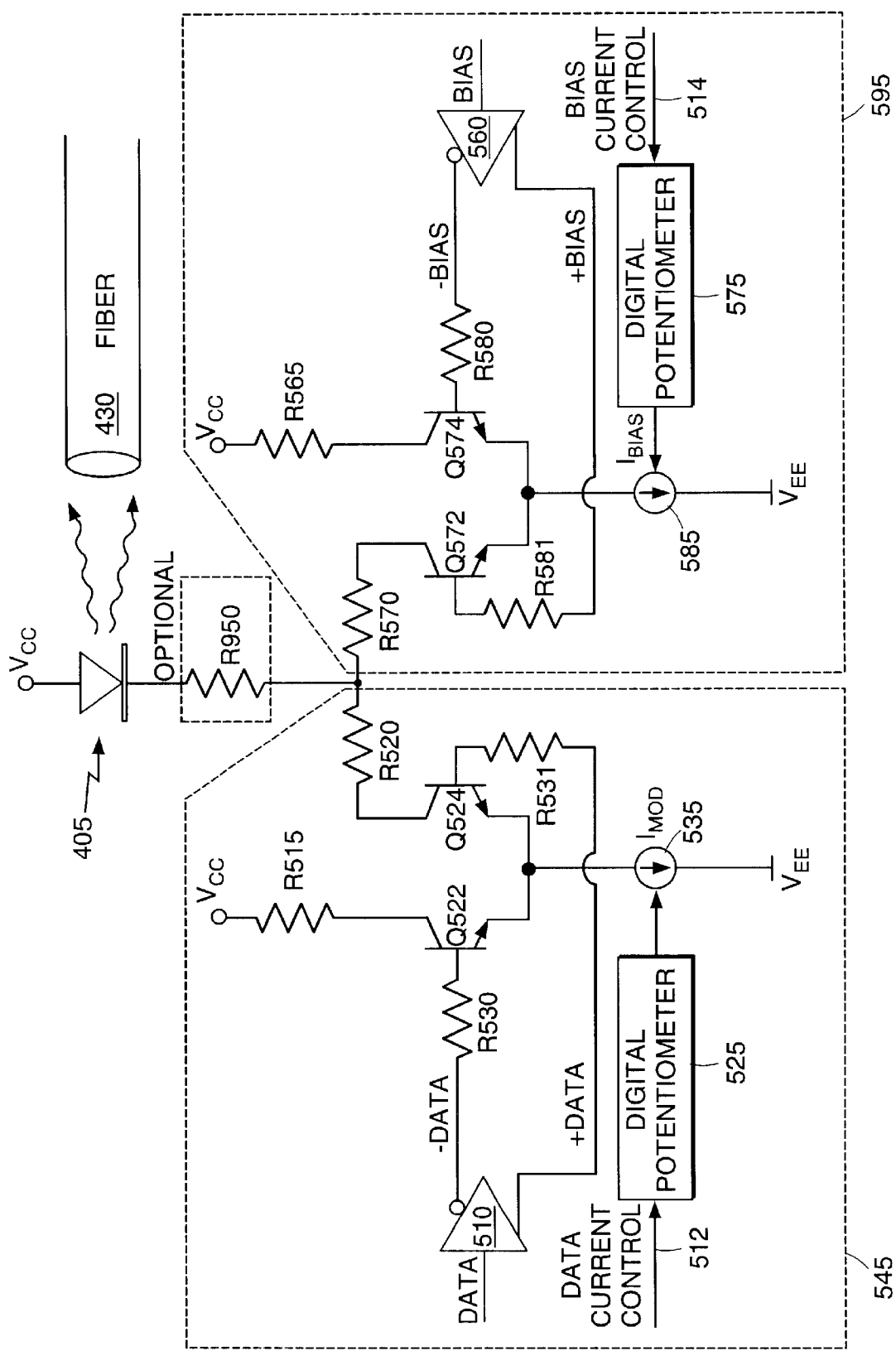
FIG. 3 is a detailed schematic diagram of a burst mode laser system according to certain principles of the present invention.

FIG. 3 is a detailed schematic diagram of a burst mode laser system according to certain principles of the present invention. Generally, circuit 545 controls a modulation current that is switched through diode 405 while circuit 595 controls a bias current switched through diode 405.

During a transmit mode, diode 405 generates a light output at one of multiple power levels. In one application, the power output of diode 405 is modulated to produce a time-varying output at power level $P_0$ and $P_1$ as shown in FIG. 1. To achieve this end, a bias current, $I_{BIAS}$, can be switched through diode 405 to produce a baseline optical output, $P_0$. This puts the diode in a lasing or near-lasing mode. A modulation current, $I_{MOD}$, can then be selectively switched through diode 405 and an alternate path to transmit a stream of binary data to a target receiver disposed to receive the light output over fiber 430. When both $I_{BIAS}$ and $I_{MOD}$ are switched to pass through diode 405, diode 405 produces a light output at power level $P_1$. Thus, the light output of diode 405 can be varied between $P_0$ and $P_1$ by driving diode 405 with $I_{BIAS}$ and selectively switching modulation current $I_{MOD}$.

Current source 585 can be adjusted to provide a bias current range typically between 1 and 100 mA (milliamps). However, any suitable current range can be used depending on the characteristics of the solid state device that is to be biased and driven. Current sources 535, 585 typically are less sensitive to temperature and can drive current to an accuracy of 0.01% that varies by 50 ppm/deg C.

Digital potentiometer 575 defines the resolution of steps in a given current range supported by current source 585. Consequently, bias control signal 514 can be digital information that selects a particular bias current selectively switched through diode 405. In one application, the bias current and modulation current are selected so that diode 405 can be driven in its non-linear region.

Selective switching of the bias current, $I_{BIAS}$, through diode 405 for lasing can be achieved via switch Q572 and switch Q574. Although these switches are shown as bipolar junction transistors, generally any suitable type of switches for redirecting current or changing the impedance of a circuit path can be used. Typically, electronic switches are used for high speed switching.

Depending on components used in FIG. 3, diode 405 can be biased in less than 1 nanosecond compared to 100 nanoseconds or more as achieved in the prior art. Accordingly, an extinction ratio, 10 log ($P_1/P_0$), of 7 to 30 dB is typically achieved.

A combination of Q572 and Q574 can comprise a differential transistor pair that is disposed in a single package. Gains of each switch can be controlled so that they are approximately equal, but this is not necessary. As shown, the emitters of each switch are tied to a common node of current source 585.

Differential driver 560 generates −BIAS and +BIAS signals that drive switch Q574 and switch Q572, respectively. During operation, a base of each transistor is driven with current to control through which switch or circuit path the bias current will pass. A gain of the switches can vary depending on the application but transistors that have a gain, G, between 20 and 100 are typically used.

In one application, differential driver 560 generates an output at voltage levels that do not cause corresponding switches to go into saturation. For example, a selected switch such as Q572 can be activated more than Q574 so that almost all of the bias current flows through a path including diode 405 and R570. Conversely, switch Q574 can be activated more than Q572 so that the bias current $I_{BIAS}$ flows through an alternate path such as through resistor R565. Faster switching can be achieved when the switches are not saturated, although the circuit will operate at high speed even though the transistors are saturated. Resistors R530, R531, R580, and R581 can be chosen so that corresponding switches do not go into saturation when driven to the 'on' state.

Current source 585 can be coupled to Vee as shown and ECL (Emitter Coupled Logic) voltage levels can be used to drive switches Q572 and Q574. More specifically, differential driver 560 can drive −BIAS to −1.745 volts and +BIAS to −0.945 volts to switch $I_{BIAS}$ through diode 405. Conversely, differential driver 560 can drive −BIAS to −0.945 volts and +BIAS to −1.745 volts to switch $I_{BIAS}$ through alternate path R565 so that diode 405 is not biased. PECL (Positive Emitter Coupled Logic), LVPECL (Low Voltage Positive Emitter Coupled Logic), or other suitable voltage levels can be used to bias the switches.

One aspect of the present invention as shown in FIG. 3 involves approximating or substantially matching the impedance of circuit paths so that a selected bias current can be maintained by current source 585 even though the current is switched to travel between different paths. For example, resistor R565 and R570 can be independently chosen so that current source 585 can precisely and accurately drive a selected current $I_{BIAS}$ that is relatively stable or constant even though it is switched between paths including Q572 and Q574.

Normally, resistors R570 and R565 are chosen in a range between 7 and 50 ohms. In one application, R565 is 15 ohms and R570 is 10 ohms. However, any suitable range of resistors can be used depending on the application.

To reduce noise during transition periods of biasing, a snubber circuit or higher resistor value for R570 greater than 20 ohms can be used for R570 and R565.

It should be noted that functionality provided by switches Q572 and Q574 can be incorporated into current source 585. In this instance, current source 585 can be driven with a digital 'enable' signal that causes bias current $I_{BIAS}$ to pass through diode 405 or an alternate path.

Similar to circuit 595, circuit 545 can be used to control the modulation current, $I_{MOD}$, through diode 405.

More specifically, data current control information 512 drives digital potentiometer 525 to adjust current source 535 so that it produces a selected modulation current. The modulation current, $I_{MOD}$, is then selectively switched through switch Q522 or switch Q524 depending on the state of signal −DATA and +DATA from corresponding differential driver 510.

The input signal to driver 510 can be binary data such as sequences of logic ones and zeros. A time varying sequence of digital data can be modulated onto a light output of diode 405 by imparting a voltage at the input of driver 510 to a high or low logic state at the appropriate time. Typically, bias current $I_{BIAS}$ is set up and switched through diode 405 prior to the switching of the modulation current, $I_{MOD}$, through diode 405 to produce a modulated light output onto fiber 430 or other medium. As previously discussed, selective switching of $I_{MOD}$ results in a light output from diode 405 between $P_0$ and $P_1$.

Resistors R515 and R520 are typically chosen from a range between 7 and 50 ohms. In one application, R515 is 15 ohms and R520 is 10 ohms. However, any suitable range of resistors can be used depending on the application.

Resistors R515, R520, R565, and R570 can be greater than 20 ohms so that the output of diode 405 makes a smooth transition when switched between levels $P_0$ and $P_1$.

Resistors R520 and R570 can be combined as resistor R950 to reduce circuit components. Otherwise, R950 can be a jumper or zero ohm resistor while R520 and R570 are chosen to be values as previously discussed.

Figure 4:
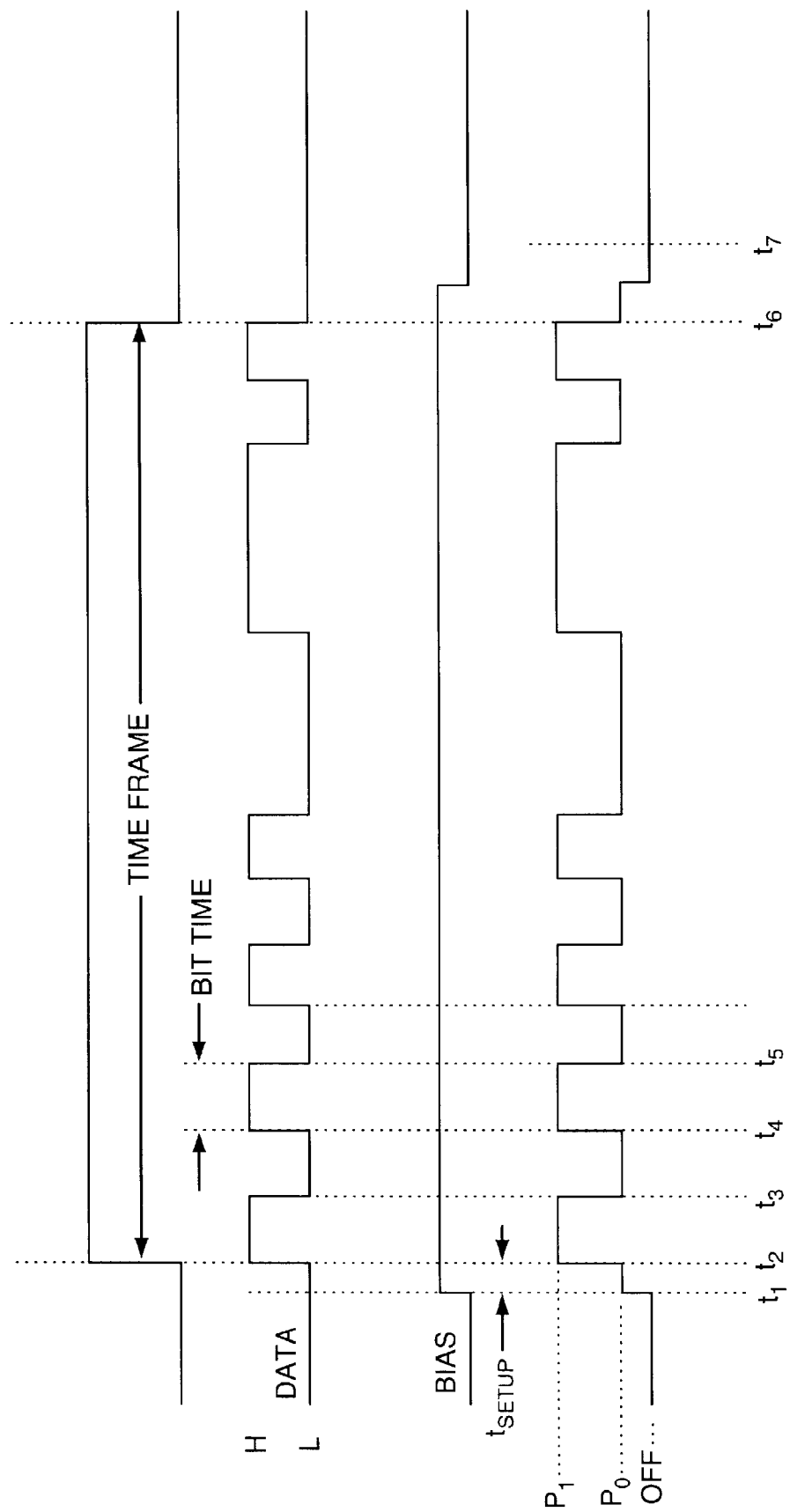
FIG. 4 is a timing diagram illustrating a method to transmit from the burst mode laser system according to certain principles of the present invention.

FIG. 4 is a timing diagram illustrating a method of transmitting data information according to certain principles of the present invention. As shown, a frame of data or data packet is transmitted as a time-varying light output signal from diode 405.

Prior to data transmissions at time $t_2$, current source 535 is controlled or adjusted to produce a selected modulation current $I_{MOD}$ that is initially switched to pass through the circuit path including R515 and Q522. Likewise, current source 585 is controlled to produce a bias current, $I_{BIAS}$, that is initially switched through the circuit path including Q574 and R565. In other words, switches Q574 and Q522 are initially switched to the "ON" state while switches Q572 and Q524 are switched "OFF" while the current is set to an appropriate value.

Current sources 535, 585 can be adjusted between frames or pre-set to a selected value in anticipation of transmitting future data.

At time $t_1$, the bias current generated by current source 585 is then switched through Q572, R570 and diode 405. Typically, diode 405 can be biased on the order of nanoseconds or picoseconds with a high speed switch. In one application, diode 405 can be biased in less than a single bit time and has a rise time of 150 to 200 picoseconds. This can be achieved because switches are used to adjust how much current passes through the diode rather than adjusting current source 585 between 0.0 mA and $I_{BIAS}$. Typically, current source 585 is a precision device that can accurately drive a selected current. However, the complex circuitry supporting such precision does not lend itself to high speed current adjustments that would be necessary to rapidly turn diode 405 on and off for transmitting.

Following set up time, $t_{setup}$, binary data information is modulated onto light output of diode 405 by switching the modulation current between paths corresponding with switches Q522 and Q524. More specifically, the modulation current produced by current source 535 is switched to pass through switch Q524 and diode 405 between time $t_2$ and $t_3$. Thereafter, the modulation current is switched back through switch Q522 between time $t_3$ and $t_4$. Accordingly, this technique of switching $I_{MOD}$ is repeated over the duration of a time frame to modulate binary data onto the light output of diode 405.

As shown between $t_6$ and $t_7$, the bias current can be switched again through Q574 instead of Q572 so that diode 405 is no longer biased for transmitting data. Note also that the modulation current $I_{MOD}$ is also switched through the circuit path including switch Q522 so that little or no current flows through diode 405 when it is not biased. The fast turn-on and turn-off time of switches Q572 and Q574 to bias diode 405 renders it possible for multiple burst mode laser systems as previously described to transmit without interfering with each other in a TDM (Time Division Multiplexed) communication system.

A time frame can include transmitting 55 bytes of information in which 53 bytes are encoded data and 2 bytes are framing information. In one application, a time frame is 700 nanoseconds in duration and each bit is on the order of 1.59 nanoseconds. Accordingly, a network system can support a bandwidth of 622 MBS, but these specifications can vary depending on the application.

Figure 5:
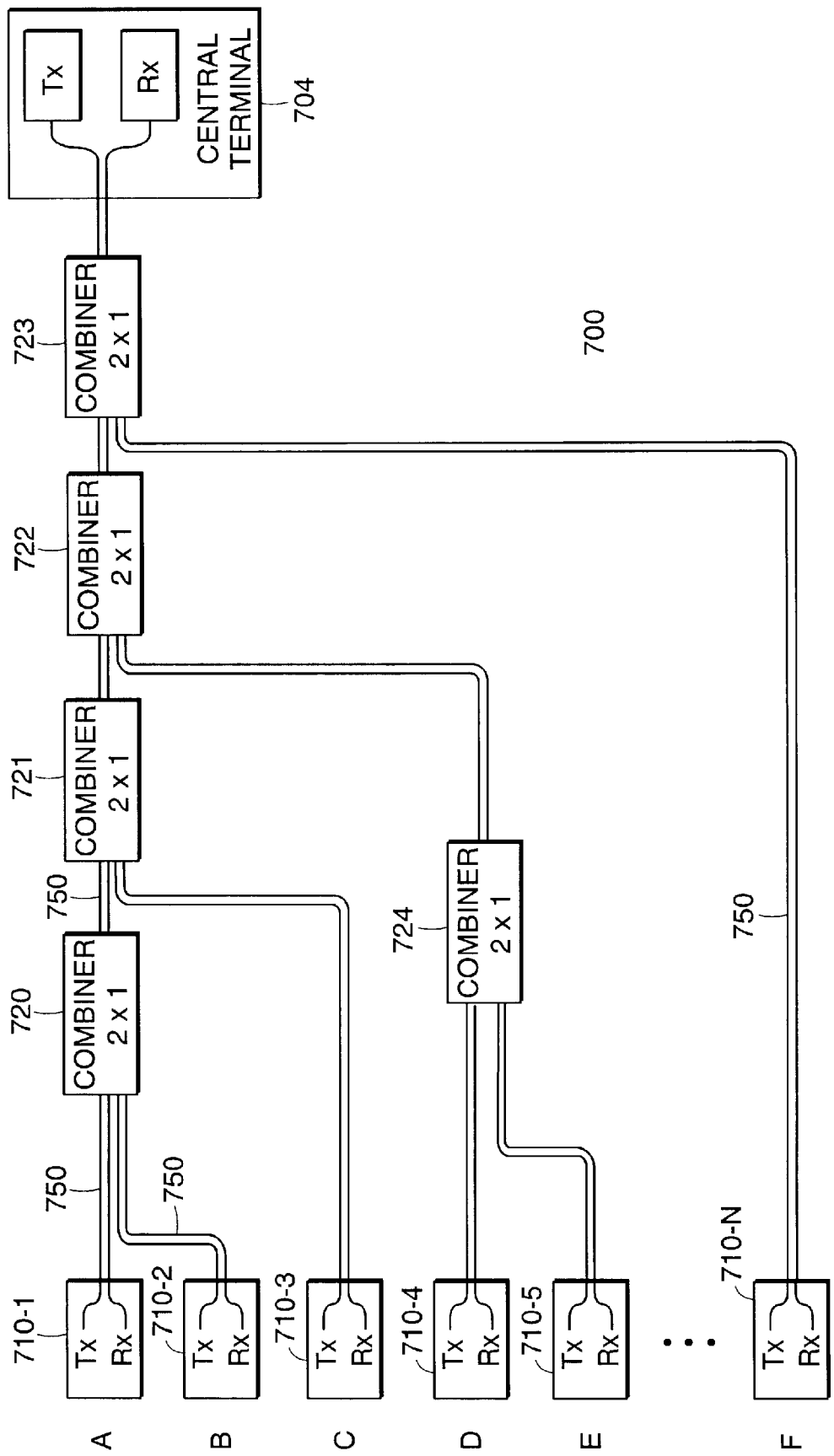
FIG. 5 is a block diagram of multiple burst mode laser systems for communicating over a shared fiber network according to certain principles of the present invention.

FIG. 5 is a diagram of an optical access system according to certain principles of the present invention. As shown, multiple remote terminal devices 710-1, 710-2, . . . 710-*n* communicate over a fiber network such as a Passive Optical Network (PON) to transmit and receive data information from central terminal 704. Each remote terminal device 710 can include both a transmitter and receiver for transmitting and receiving optical signals to and from central terminal 704.

In one application, each of the remote terminal devices 710 receives an optical signal that is continuously, periodically or intermittently transmitted from central terminal 704. To differentiate data flows from the central terminal 704 to remote terminals 710, central terminal 704 can generate downstream optical signals based on TDM (Time Division Multiplexed) standards or another suitable protocol. Consequently, central terminal 704 can simultaneously maintain individual communication links with each of the remote terminals 710.

In a reverse direction, the remote terminals 710 can communicate with central terminal 704 using a communication protocol such as TDM (Time Division Multiplexed) techniques. In this instance, the remote terminals 710 can be dynamically assigned one or multiple time frames in which to transmit bursts of data information to the central terminal 704. Time frames can be assigned for use on an as-needed basis by central terminal 704. Based on the coordination of multiple burst mode laser systems in each of the remote terminals 710, data information can be efficiently communicated over fiber network 700 to central terminal 704. More specifically, the bandwidth of information transmitted on a fiber network can be optimized so that minimal time is wasted setting up each of the laser diodes for transmitting data information.

It should be noted that other suitable protocols or standards for transmitting data information from a remote terminal 710 to central terminal 704 can be used in lieu of TDM techniques.

Figure 6:
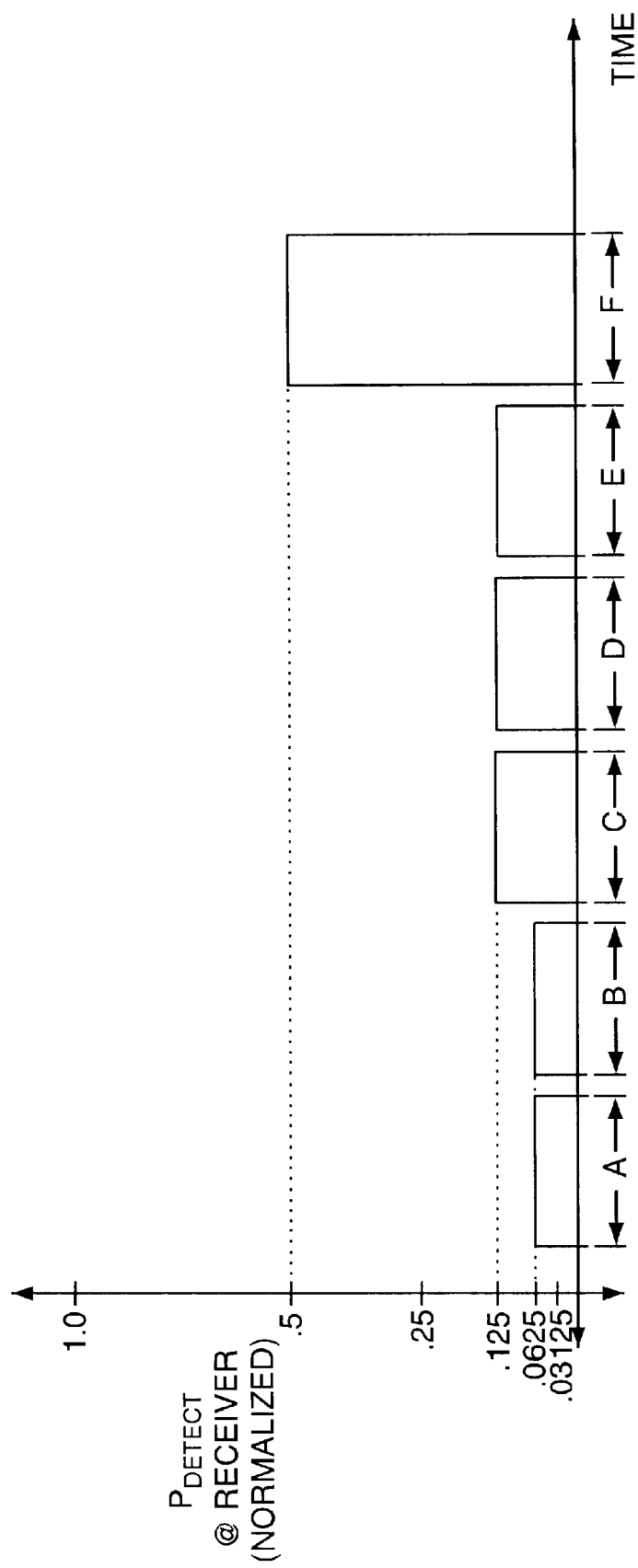
FIG. 6 is a graph of light power output from each of multiple burst mode lasers transmitting at different time intervals according to certain principles of the present invention.

FIG. 6 is a graph illustrating attenuation of corresponding optical signals transmitted from each of multiple burst mode laser systems according to certain principles of the present invention. As shown, an optical signal as transmitted from each remote terminal device 710 can be attenuated by combiners, and other non-ideal components disposed in optical system 700.

One aspect of the present invention as discussed is directed towards reducing the time it takes to bias a diode laser so that it can be used almost immediately to transmit data to a target without interfering with other devices sharing optical system 700. To achieve this end, laser diodes in each of the remote terminal devices 710 can be almost completely shut off when data information is not actively being transmitted. Consequently, there is little if any offset light received at central terminal 704 from diodes that are not biased to transmit data. When the individual burst mode laser devices are specifically modulated and biased during a time frame in this way, it is a simpler task to receive and demodulate a corresponding signal at central terminal 704. For example, it is easier to retrieve a modulated signal with a receiver at central terminal 704 when unnecessary light generated by each of the non-transmitting laser diodes is reduced or minimized.

Figure 7:
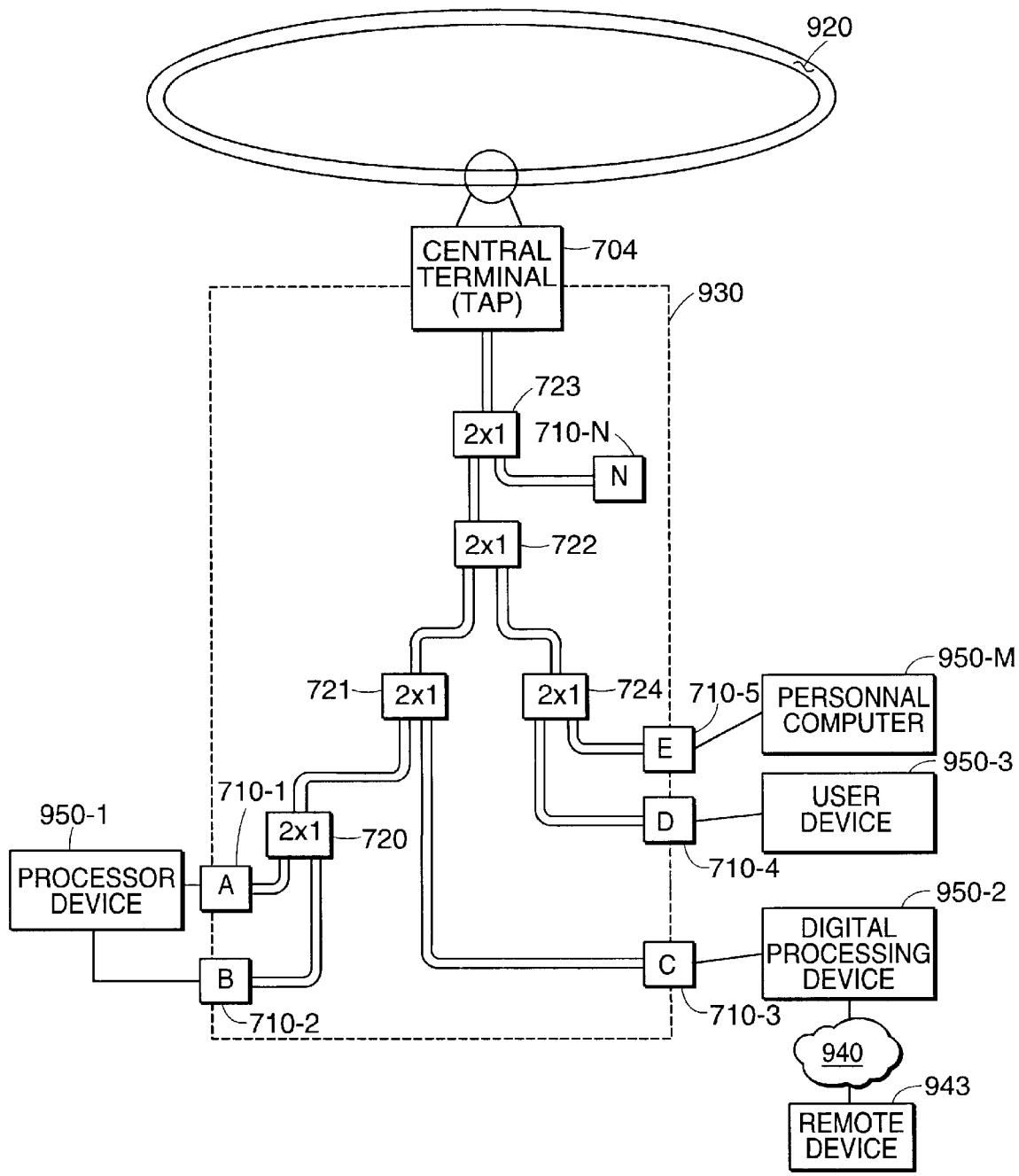
FIG. 7 is a diagram of a network system according to certain principles of the present invention.

FIG. 7 is a block diagram of a network system including multiple burst mode laser devices according to certain principles of the present invention. As shown, central terminal 704 can be used to tap into network 920 such as a SONET ring network. Thus, digital processor devices 950-1, 950-2 . . . 950-m can be coupled to remote terminals 710 for processing received data and generating data to be transmitted over passive optical network 930.

In one application, remote device 943 coupled to network 940 can communicate through digital processor device 950-2 such as a server and network 930 to other devices in communication with network 920. The FSAN (Fiber Service Access Network) protocol can be used to communicate data on network 930.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of supporting communication comprising:
   coupling first and second differential transistor pairs to a laser diode at a common node;
   setting a current source to provide a first current;
   switching the first current through the diode or an alternate path to selectively bias the diode or shunt the first current; and
   modulating a light energy output transmitted from the diode by selectively switching a second current through the diode while the first current is switched to bias the diode, wherein the light energy output of the diode is proportional to a total current through the diode;
   wherein switching includes independently switching the first and second currents through the diode based on respective outputs of first and second differential drivers coupled to the respective first and second differential transistor pairs.

2. A method as in claim 1 further comprising:
   coupling the light energy output of the diode to a fiber and transmitting information over an optical network via time division multiplexing.

3. A method as in claim 1 further comprising:
   disposing a resistor in series with the diode, through which the first and second current flow when the diode is in a biased mode.

4. A method as in claim 3, wherein the resistor is greater than 20 ohms.

5. A method as in claim 1 further comprising:
   coupling the light energy output of the diode to a fiber of a passive optical network.

6. A method as in claim 5, wherein the passive optical network is coupled to a SONET ring network.

7. A method as in claim 1 wherein coupling first and second differential transistor pairs to the laser diode at a common node includes:
   disposing a first switch in series with the diode and a second switch along the alternate path; and
   controlling the first switch to have a lower impedance than the second switch to selectively switch the first current to bias the diode.

8. A method as in claim 1 wherein coupling first and second differential transistor pairs to the laser diode at a common node includes:
   disposing a first switch in series with the diode and a second switch along the alternate path; and
   controlling the second switch to have a lower impedance than the first switch to steer the first current through the alternate path.

9. A method as in claim 7 further comprising:
   driving the first and second switches with a differential signal output of the first differential driver to selectively bias the diode.

10. A method as in claim 9, wherein the differential signal is based on ECL (Emitter Coupled Logic) voltage levels and the switches are bipolar transistors.

11. A method as in claim 1, wherein an extinction ratio of the light energy output of the diode while biased is greater than 15 dB.

12. A method as in claim 1 further comprising:
   in between transmitting data packets, adjusting the first or second current.

13. A method as in claim 1, wherein the alternate path has an impedance similar to a path including the diode.

14. A method as in claim 1, wherein an output of the first differential driver is switched to either of two states to selectively bias the diode end the second differential driver is switched between either of two states to modulate the diode.

15. An apparatus for supporting communication comprising:
   a first current source that generates a first current;
   a first differential transistor pair comprising first and second switches for respectively switching the first current trough a diode to bias the diode or shunt the first current through an alternate path; and
   a second current source that generates a second current;
   a second differential transistor pair coupled to the laser diode at a common node for selectively switching the second current through the diode to modulate a light energy output that is transmitted from the diode while the first current is switched to bias the diode, wherein the light energy output of the diode is proportional to a total current through the diode.

16. An apparatus as in claim 15, wherein the light energy output of the diode is coupled to a fiber to transmit information over an optical network via time division multiplexing.

17. An apparatus as in claim 15 further comprising:
a resistor in series with the diode, the first current also flowing through the resistor when the diode is biased.

18. An apparatus as in claim 15, wherein the resistor has a resistance greater than 20 ohms.

19. An apparatus as in claim 15 further comprising:
a fiber of a passive optical network to which the light energy output of the diode is coupled.

20. An apparatus as in claim 19, wherein the passive optical network is coupled to a SONET ring network.

21. An apparatus as in claim 15, wherein the first switch is disposed in series with the diode and a second switch is disposed along the alternate path.

22. An apparatus as in claim 21 further comprising:
a first signal that, depending on its voltage level, selectively activates the first switch to have a lower impedance than the second switch to direct the first current through the diode; and
a second signal that, depending on its voltage level, selectively activates the second switch to have a lower impedance than the first switch to selectively switch the first current through the alternate path and not through the diode.

23. An apparatus as in claim 22 further comprising:
a driver that generates a differential output comprising the first and second signals that are used to selectively bias the diode.

24. An apparatus as in claim 23, wherein the differential output is based on ECL (Emitter Coupled Logic) voltage levels and the first and second switches are bipolar transistors.

25. An apparatus as in claim 15, wherein an extinction ratio of the light energy output of the diode while biased is greater than 15 dB.

26. An apparatus as in claim 15, wherein the alternate path has an impedance similar to a path including the diode.

27. An apparatus as in claim 15, wherein the first and second currents are respectively switched through the diode based on an output of a first and second differential amplifier.

28. An apparatus as in claim 27, wherein an output of the first differential amplifier is switched to selectively bias the diode and the second differential amplifier is switched to modulate the diode.

29. A burst mode laser driver system comprising:
a modulation differential transistor pair coupled to a laser diode, the modulation differential transistor pair controlling, a modulation current through the laser diode;
a bias differential transistor pair coupled to the laser diode, the bias differential transistor pair controlling a bias current through the laser diode and switching the bias current on or off in less than a single bit time of modulated data in a burst mode;
wherein the modulation differential transistor pair and the bias differential transistor pair are coupled to the laser diode at a common node, and wherein control of the modulation current by the modulation differential transistor pair and control of the bias current by the bias differential transistor pair is independent.

30. A method for high speed switching a diode comprising:
coupling first and second differential transistor pairs to a laser diode at a common node;
producing a first differential output comprising complementary first and second switch control signals coupled to the first differential transistor pair;
setting he first differential output to either of two states to selectively bias the diode for high speed switching;
producing a second differential output comprising complementary third and fourth switch control signals coupled to the second differential transistor pair; and
setting the second differential output to either of two states to selectively modulate the diode for transmitting binary information.

31. A method as in claim 30, wherein the first and second control signals drive switches of the first differential transistor pair that are used to selectively switch a bias current through the diode or an alternate path.

32. A method as in claim 30, wherein the third and fourth control signals drive switches of the second differential transistor pair that are used to selectively switch a modulation current through the diode or an alternate path.

33. A high speed switching driver comprising:
first and second differential transistor pairs coupled to a laser diode at a common node;
a first circuit device that produces a first differential output comprising complementary first and second signals coupled to the first differential transistor pair, the first differential output being set to either of two states;
a second circuit device that produces a second differential output comprising complementary third and fourth signals coupled to the second differential transistor pair, the second differential output being set to either of two states;
wherein the diode is selectively biased depending on the first differential output of the first circuit device and is selectively modulated depending on the second differential output of the second circuit device.

34. A high speed switching driver as in claim 33, wherein the first and second control signals drive switches that are used to selectively switch a bias current through the diode or an alternate path.

35. A high speed switching driver as in claim 33, wherein the third and fourth control signals drive switches that are used to selectively switch a modulation current through the diode or an alternate path.

* * * * *